United States Patent [19]
Nara et al.

[11] Patent Number: 5,985,496
[45] Date of Patent: *Nov. 16, 1999

[54] EXPOSURE METHOD AND APPARATUS

[75] Inventors: Kei Nara, Yokohama; Toshio Matsuura, Tokyo, both of Japan

[73] Assignee: Nikon Corporatioin, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/837,277

[22] Filed: Apr. 11, 1997

[30]     Foreign Application Priority Data

Apr. 12, 1996  [JP]  Japan ................................. 8-090660

[51] Int. Cl.$^6$ ............................. G03F 7/20; H01L 21/027
[52] U.S. Cl. ............................. 430/30; 430/396; 355/68; 355/77; 250/205
[58] Field of Search ................... 430/30, 396; 355/68, 355/77; 250/205

[56]         References Cited

U.S. PATENT DOCUMENTS

| | | | |
|---|---|---|---|
| 5,579,147 | 11/1996 | Mori et al. | 359/204 |
| 5,581,075 | 12/1996 | Naraki et al. | 250/205 |
| 5,668,624 | 9/1997 | Naraki et al. | 355/53 |

*Primary Examiner*—John A. McPherson
*Attorney, Agent, or Firm*—Michael M. Meller; Eugene Lieberstein

[57]         ABSTRACT

An exposure apparatus for exposing a photomask pattern onto a photosensitive substrate via a plurality of optical systems includes a source of illumination for irradiating the photomask pattern with beams of light adapted to pass through the pattern and optical systems onto the substrate. A scanning mechanism for synchronously scanning the photomask pattern with the beams of light is included to transfer the pattern to the substrate. A plurality of illumination intensity measuring devices is provided for substantially simultaneously measuring the illumination intensities of the beams of light passing through the optical systems.

18 Claims, 16 Drawing Sheets

EXPOSURE METHOD AND APPARATUS

BACKGROUND OF THE INVENTION

The present invention relates to an exposure method and apparatus. More specifically, the present invention relates to an exposure method and apparatus which controls illumination intensity.

In recent years, liquid crystal display devices have been used as display elements for word processors, personal computers, TV sets, etc.

A liquid crystal display device is formed by photolithographically patterning transparent thin-film electrodes on a glass substrate. An exposure apparatus is known as an apparatus to serve the purpose of photolithography. The primary pattern formed on a mask is exposed onto a photoresist layer formed on the glass substrate via a projection lens.

Recently, the trend toward liquid crystal display devices has become greater and an increase in the size of the glass substrate has been demanded. From a manufacturing efficiency point of view, a plurality of display devices are exposed at the same time in many cases. Also an increase in the exposure region for an exposure apparatus has been required.

To meet the demand for larger exposure regions, a scanning exposure apparatus having a plurality of projection lenses as shown in FIG. 1 has become available.

In the prior art apparatus of FIG. 1, a mask 2 has a photolithographic pattern printed thereon. A plate 4 (glass substrate) has an upper photoresist surface and is attached to a carriage (not illustrated). Between the mask 2 and the plate 4 are located a plurality of optical systems or projection lenses 5 through 9 which direct a set of divided erect images of a pattern on the mask 2 to the plate 4. The pattern from the mask 2 are thereby printed on the plate 4 in a piecewise manner.

As illustrated, the projection optical systems 5, 6, 7, and 8, 9 are spaced at a predetermined distance from each other and each of the exposure regions are staggered such that they slightly overlap each other.

An illumination system 3 for exposure comprises illumination units 3a through 3e whose optical axes are respectively aligned with the projection lenses 5 through 9. An illumination adjustment mechanism (not illustrated) is built into the illumination units 3a through 3e.

In the above prior art configuration, after the mask 2 and the plate 4 are aligned, the relative position and distance between them are maintained while they are moved in the scanning direction A with respect to the illumination system 3 and the projection lenses 5 through 9. The mask 2 and the plate 4 are moved by a carriage drive mechanism such that the photomask patterns which continue on the mask 2 are divided by means of the projection lenses 5 through 9 to be exposed onto the plate 4.

In this way, the pattern on the entire surface of the mask 2 is transferred onto the plate 4. However, when the illumination intensities are dispersed among each of the projection lenses, the resulting re-synthesized pattern has various line widths which are dependent on the arrangement of the projection lenses.

Luminous intensity is dispersed due to the variation in the transmittivity of the projection optical systems 5 through 9 and the variation in the illumination intensity of the illumination units 3a through 3e. In order to prevent such unfavorable conditions, a new configuration having a sensor S0 for measuring light has been proposed so as to control the illumination intensity based on the output from the illumination sensor S0.

The sensor S0 for measuring light is installed onto a carriage (not illustrated) holding the mask 2 and the plate 4 such that the sensor is movable in the B direction of FIG. 1 on the carriage.

The carriage is also movable in the A direction for scanning exposure on the mask 2 and the plate 4. If the projection lenses 5 through 9 are relatively movable to a point at the right edge of the mask 2 and a point at the right edge of the plate 4 in FIG. 1, the sensor S0 can measure illumination intensity at an arbitrary point for each of the projection lenses by scanning with the sensor S0 in the B direction from such point.

FIGS. 2 through 5 show how illumination is measured in such prior art arrangement.

FIG. 2 shows the positional relationship between the carriage and optical systems when measuring illumination for projection lenses 8 and 9.

The sensor S0 is moved in the B direction to measure illumination for the projection lenses 8 and 9.

FIG. 3 shows the shapes and arrangement, on the imaging surface of the plate 4, of the exposure regions of the projection lenses 5 through 9. Each of the projection lenses 5 through 9 has a built-in field stop which comprises a trapezoid exposure region shown in FIG. 3. Each stop is arranged such that the shorter edge of the trapezoid exposure region of a set of the projection lenses 5 through 7 faces the shorter edge of the stops for lenses 8 and 9. Viewing from the scanning direction A, it is clear that the set of projection lenses 5 through 7 facing the set of lenses 8 and 9 are arranged such that the slopes of the trapezoid exposure regions overlap each other.

In prior art apparatus, to serve the purpose of controlling illumination, a method of measuring the illumination of the overlapped portions of the exposure regions has been proposed. In other words, as shown in FIG. 3, illumination intensities I1, I1', I3, and I3' are measured for the overlapped portions a1 through a4 respectively.

As shown in FIGS. 4 and 5, the carriage can be moved so that the illumination intensities I0, I0', I2, I2', I4, and I4' are measured in the same manner for the overlapped portions b1 through b6, respectively, of the set of projection lenses 5, 6, and 7.

Examples of the results obtained from the illumination measurements performed with the above prior art method are shown in FIG. 6. If there is a difference in illumination intensities (I0'-I1, I1'-I2, I2'-I3, I3'-I4) between adjacent projection lenses, the width of the line in the photomask pattern changes sharply. Thus zero or minimum illumination differences can be made by means of illumination adjustment mechanisms built into the illumination units 3a through 3e.

FIG. 7 shows the result of an adjustment example in which illumination intensities of the projection lenses 6, 7, 8, 9 are adjusted such that the difference in illumination between their overlapped portions is zero while fixing the illumination intensity I0 of the projection lens 5. In other words, using the illumination of the projection lens 5 as a standard, each of the illumination system units 3a through 3e of the illumination system 3 is controlled according to the illumination intensity I0 such that the illumination intensities at overlapped portions conform as I0' and I1, I1' and I2, I2' and I3, and I3' and I4 for the projection lenses 8, 6, 9, 7 in that order to eliminate a sharp change in illumination intensities for each of the positions of the projection lens 5. J0 through J5 in FIG. 7 shows the final illumination at overlapped portions for each of the positions of the projection lens 5.

In the above conventional technique, a scanning mechanism is required for light measurement, making the configuration complex. This provides problems in terms of cost effectiveness. Also scanning by means of the illumination sensor is time consuming. In addition, because scanning for measuring light takes place outside the scanning exposure regions, the illumination difference cannot be checked during the exposure sequence. This provides a further problem.

Moreover, regarding the exposure control, in the technique in which the measurement taken by a sensor at the edge is used as a baseline, if the projection lens at the edge provides an unusual value, it may be impossible to obtain a normal exposure under certain circumstances. This is due to the fact that other illumination intensities are determined based on the measurement taken by the sensor.

SUMMARY OF THE INVENTION

Therefore, it is an object of the present invention to overcome the problems resulting from prior art systems.

Another object of the present invention is to provide an exposure apparatus which is compact, light, and inexpensive. Also, such apparatus should measure and control illumination through projection lenses quickly, accurately, and with a capability of calibrating illumination during the exposure sequence.

A preferred method incorporating the principles of the present invention includes a method for exposing a photomask pattern onto a photosensitive substrate via a plurality of optical systems. The method includes the steps of irradiating the photomask pattern with beams of light adapted to pass through the pattern and the optical systems onto the substrate, and synchronously scanning the photomask pattern with the beams of light to transfer the pattern to the substrate. Finally, the method includes substantially simultaneously measuring the illumination intensities of the beams of light passing through the optical systems.

Another preferred method includes the additional steps of measuring the illumination intensities of at least two adjacent optical systems of the plurality of optical systems, and controlling the illumination intensities of the plurality of optical systems based on such measurement.

In a further method, the illumination intensities of the plurality of optical systems are controlled such that the difference in illumination intensities between adjacent optical systems is small.

Other method steps incorporating the principles of the present invention may include determining a desired target illumination intensity and controlling the illumination intensities of the plurality of optical systems such that the difference in illumination intensities between adjacent optical systems is small and the average value of the illumination intensities of all of the optical systems is in accordance with the target intensity.

A preferred embodiment of the present invention includes an exposure apparatus for exposing the photomask pattern onto a photosensitive substrate via a plurality of optical systems. The apparatus includes a source of illumination for irradiating the photomask pattern with beams of light adapted to pass through the pattern and the optical systems onto the substrate. A scanning mechanism is included for synchronously scanning the photomask pattern with the beams of light to transfer the pattern to the substrate. Finally, a first plurality of illumination intensity measuring devices is included for substantially simultaneously measuring the illumination intensities of the beams of light passing through the optical systems.

In another preferred embodiment, at least one of the first plurality of measuring devices measures the illumination intensities of at least two adjacent optical systems of the plurality of optical systems, and a controller is included which controls the illumination intensities of the plurality of optical systems based on the measurement by the one measuring device.

In a further preferred embodiment, the controller determines a desired target illumination intensity and controls the illumination intensities of the plurality of optical systems such that the difference in illumination intensities between adjacent optical systems is small and that the average value of the illumination intensities of all of the optical systems is in accordance with the target intensity.

BRIEF DESCRIPTION OF THE DRAWINGS

The above and other objects, features, and advantages of the present invention will become more apparent from the following detailed description taken with the accompanying drawings, in which.

DESCRIPTION OF THE PREFERRED EMBODIMENTS

Figure 1:
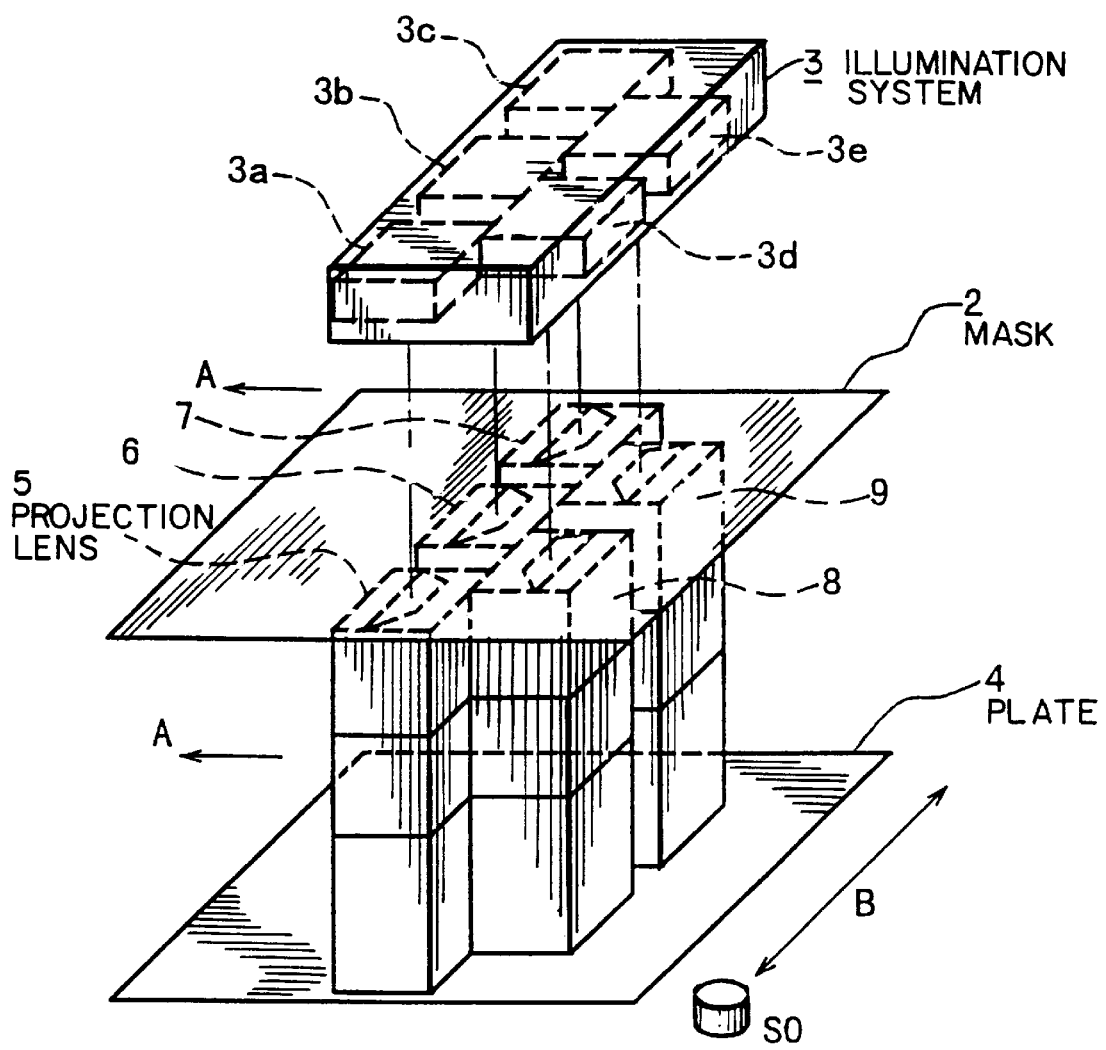
FIG. 1 is a perspective diagram showing the configuration of a conventional exposure apparatus.
Figure 2:
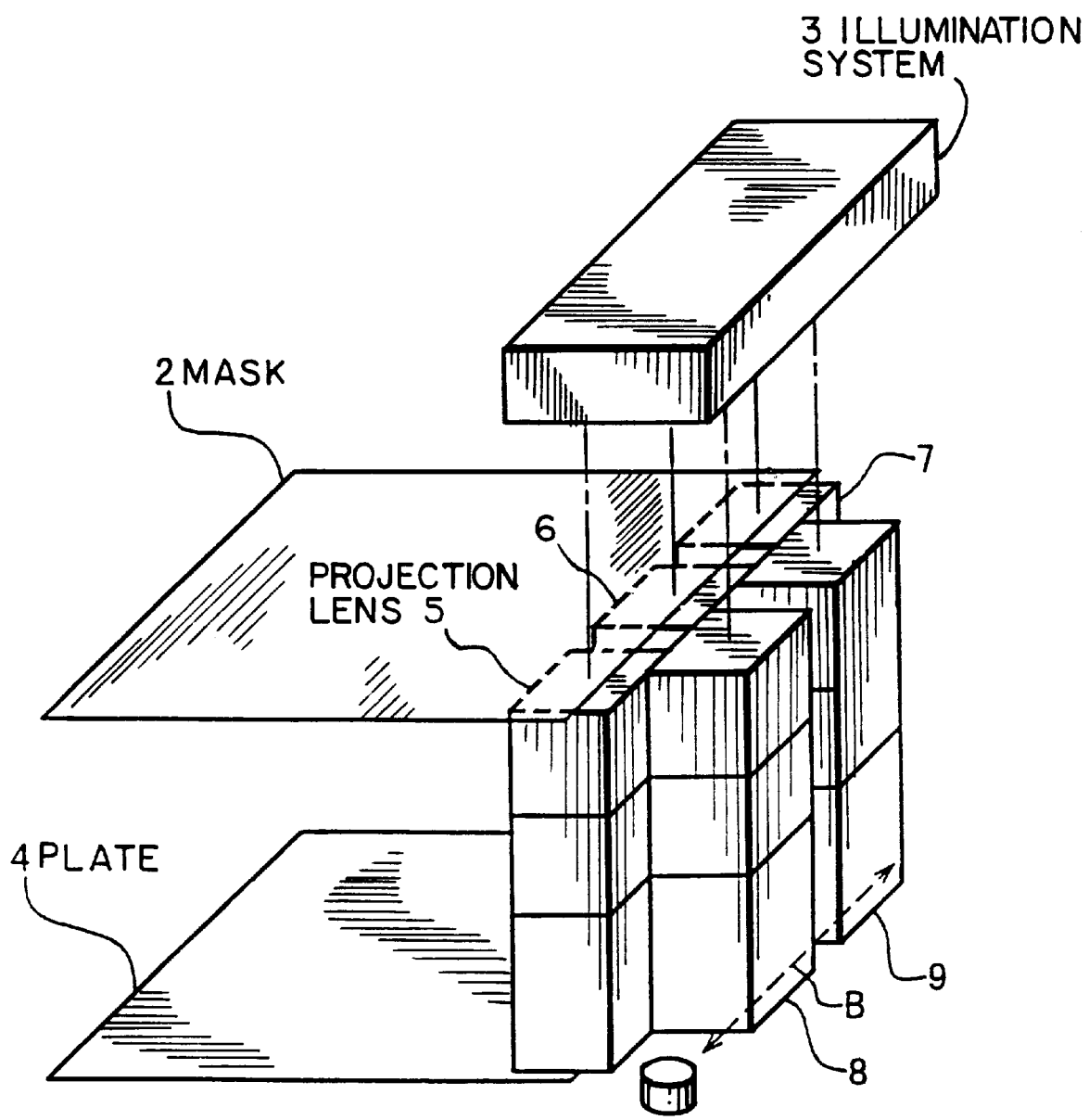
FIG. 2 is a perspective diagram showing the way illumination intensities are measured in a conventional exposure apparatus.
Figure 3:
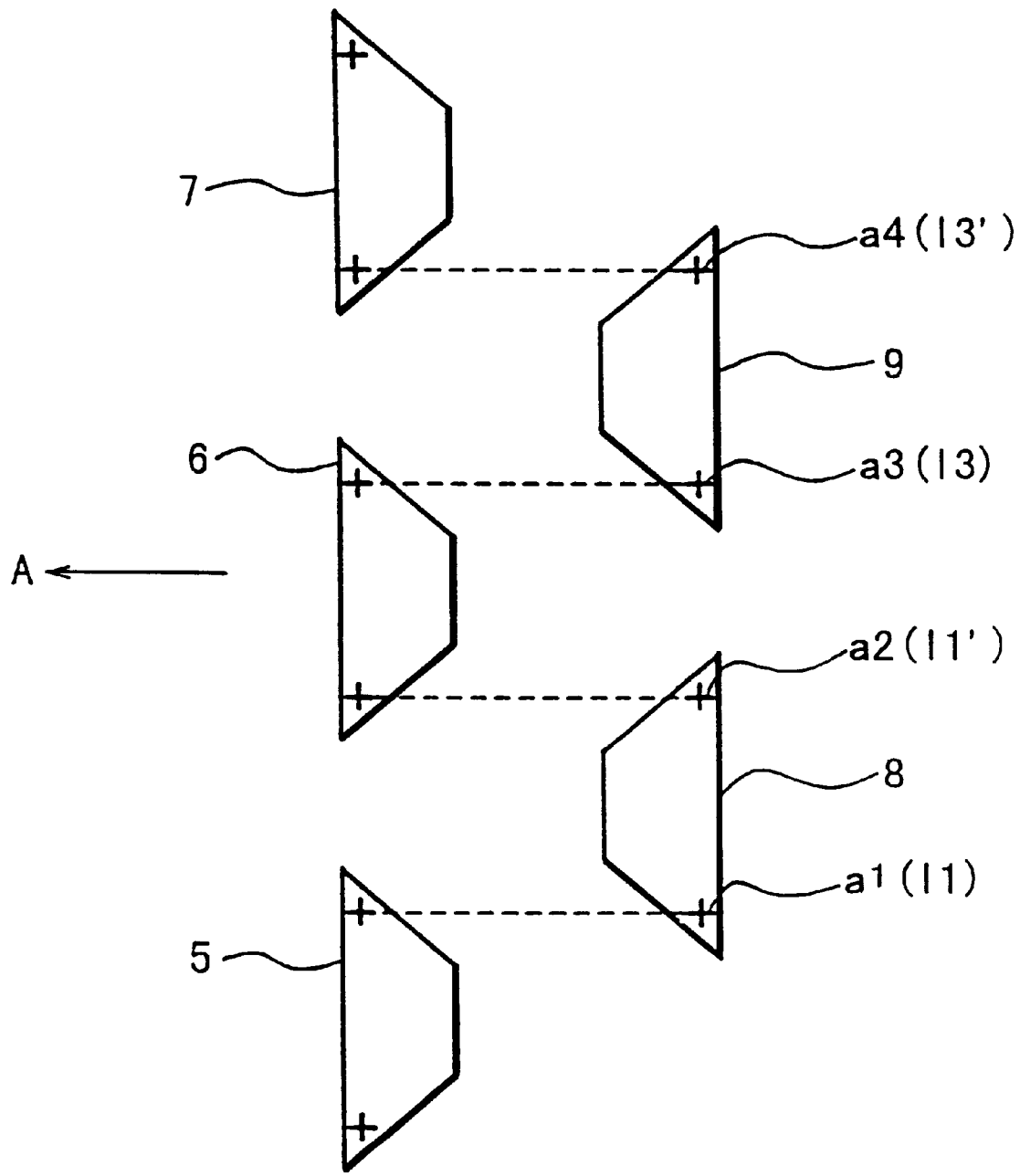
FIG. 3 shows the shapes and arrangements on the imaging surface of the substrate of the projection lenses showing the way illumination intensities are measured in a conventional exposure apparatus.
Figure 4:
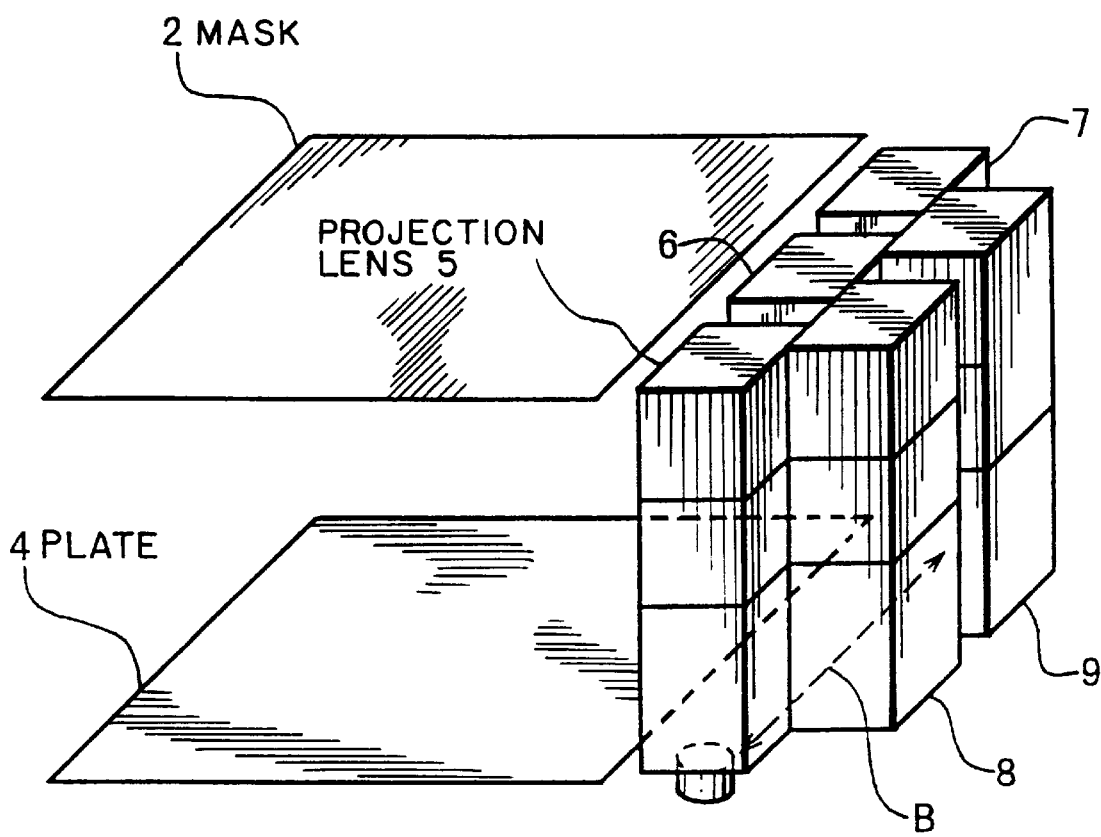
FIG. 4 is a perspective diagram showing the positions of the projection lenses when illumination intensities are measured in a conventional exposure apparatus.
Figure 5:
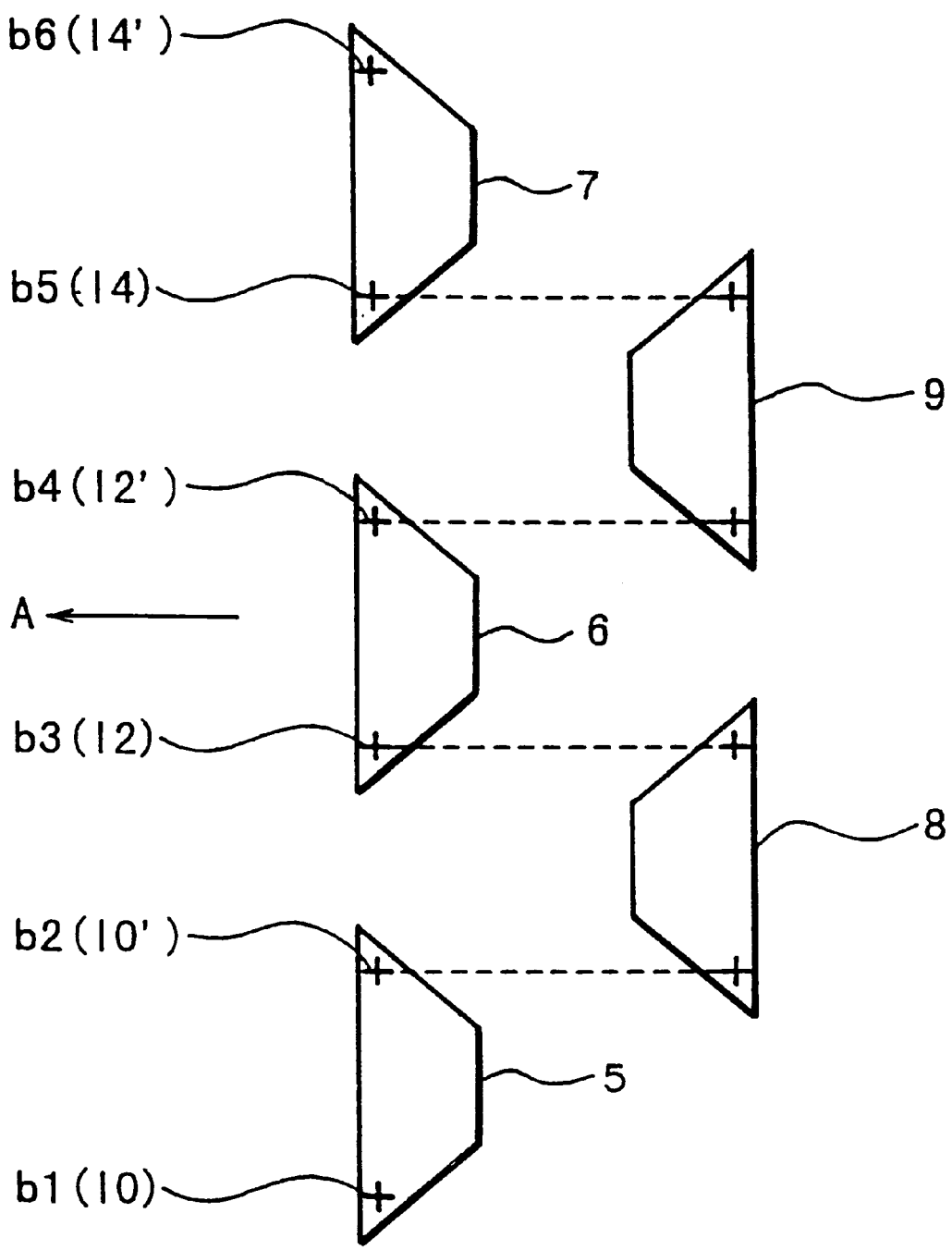
FIG. 5 is a diagram similar to FIG. 3 showing the way illumination intensities are measured in a conventional exposure apparatus.
Figure 6:
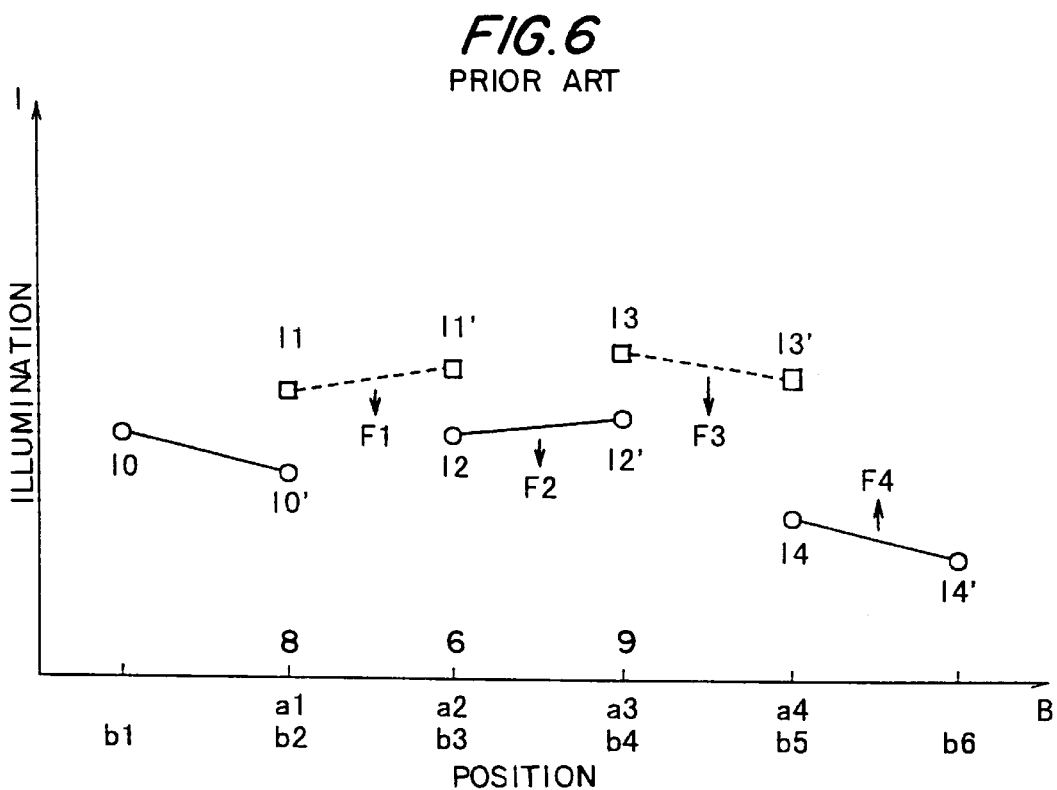
FIG. 6 is a line graph showing the results of the illumination intensity measurements taken by a conventional exposure apparatus.
Figure 7:
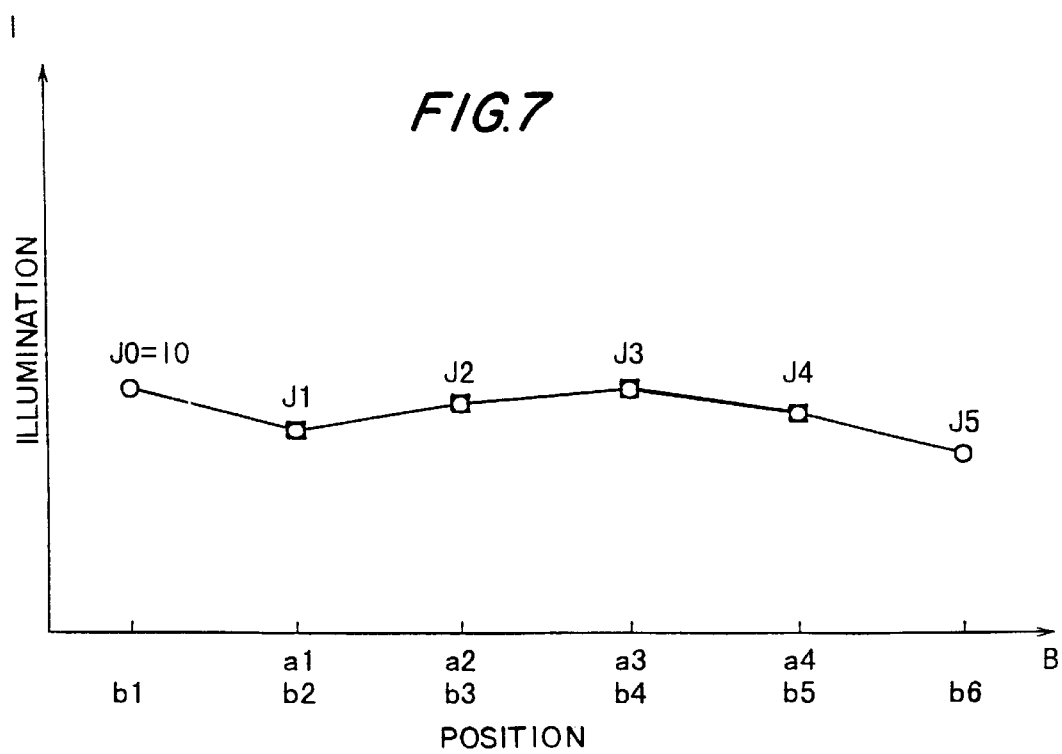
FIG. 7 is a line graph showing the results of the illumination intensity adjustment performed by a conventional exposure apparatus.
Figure 8:
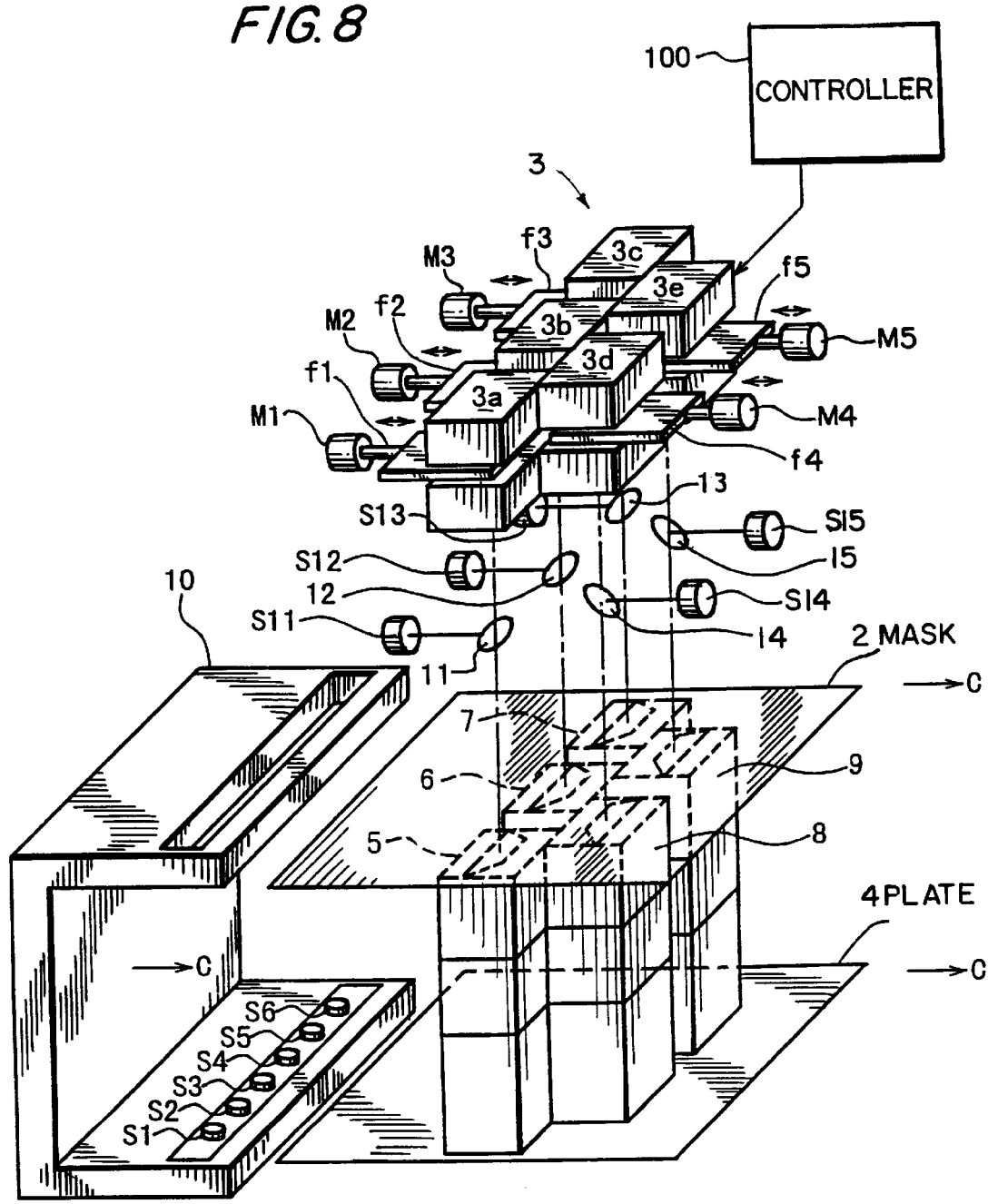
FIG. 8 is a perspective diagram showing the configuration of an embodiment of an exposure apparatus incorporating the principles of the present invention.

Referring to the drawings, FIG. 8 is a diagrammatic representation of a first embodiment of an exposure apparatus incorporating the principles of the present invention. Here, the same numerals are used to denote the same members as in the prior art and detailed descriptions for them are not repeated.

In the structure shown in FIG. 8, a plurality of sensors S1 through S6 are arranged to measure illumination intensity and the difference in illumination intensities at the emission side of the projection lenses. These sensors S1 through S6 are fixed onto a calibration unit 10. The calibration unit 10 is rigidly attached to a carriage. In FIG. 8, the scanning direction of the carriage is indicated by the arrow C.

Figure 9:
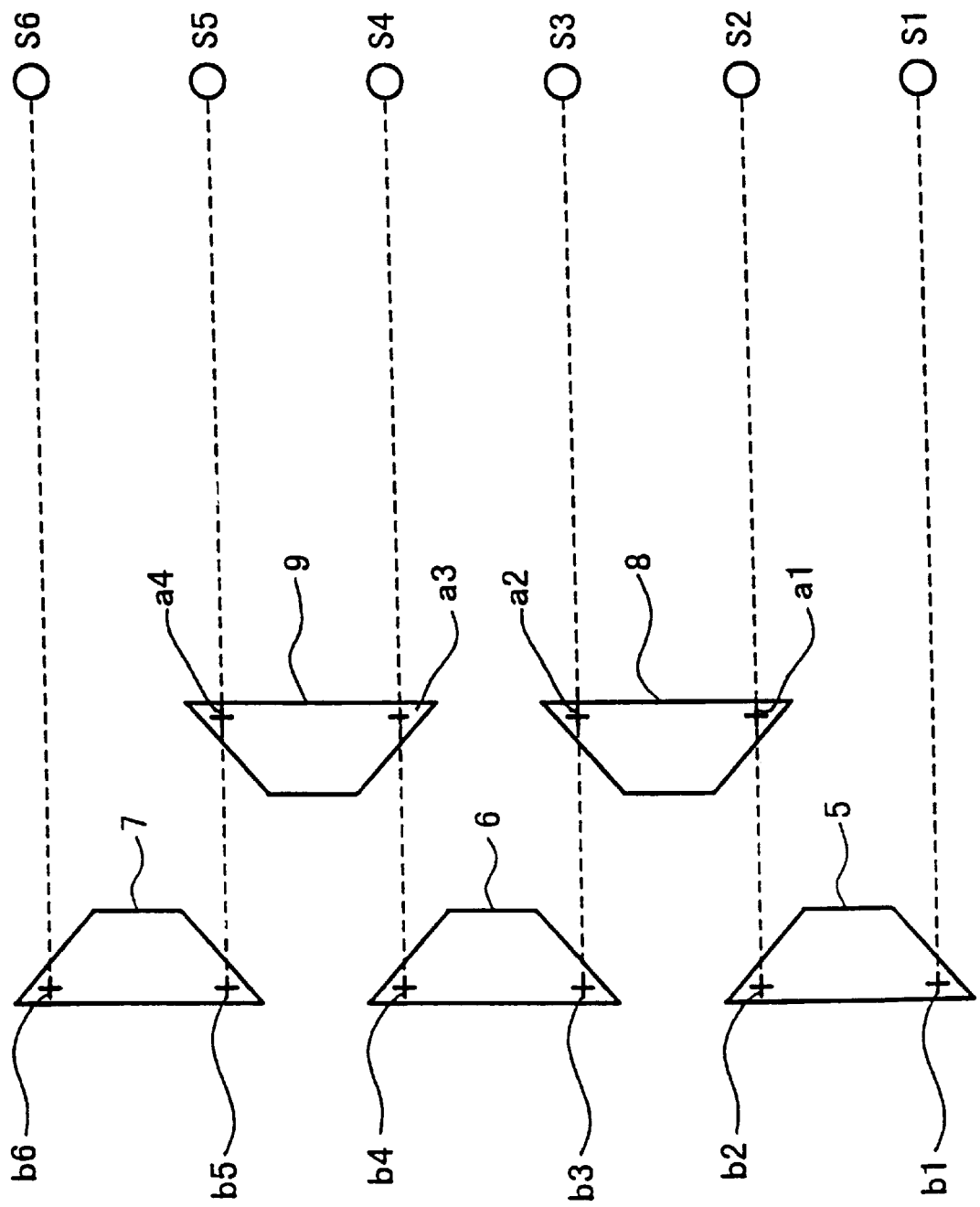
FIG. 9 is a diagram showing the relationship between a photosensor at the entering side of a projection lens and the illumination field of the embodiment of FIG. 8.

Referring to FIG. 9, it can be seen that the sensors S1 through S6 are arranged such that illumination intensities can be measured at least at the overlapped portions among all of the illumination fields of the projection lenses. For example, the sensor S2 is arranged at a position at which illumination intensities at the overlapped portions a1, b2 for both projection lenses 5 and 8 are measured. The carriage to which calibration unit 10 is attached is moved to select which is to be measured, the projection lens 5 or 8. Sensors S3 through S5 are also arranged at positions where illumination intensity is measured at each of the overlapped portions.

FIG. 8 shows the detailed configuration of the illumination system 3. Filters f1 through f5 are provided and can be inserted into illumination units 3a through 3e, respectively, in order to adjust illumination intensity. These filters f1 through f5 are for example gradation filters which are drivable in the direction of the illustrated arrows by motors (or solenoids) M1 through M5, and control the intensities of the illumination which enters the projection lenses 5 though 9 by adjusting the transmittance of optical systems in the illumination units 3a through 3e.

Also in order to adjust illumination even during the exposure sequence, half mirrors 11 through 15 are arranged in the respective optical paths between the illumination units 3a through 3e and the projection lenses 5 through 9. Additional sensors S11 through S15 are provided to cooperate, respectively, with half mirrors 11 through 15 for control purposes as will be explained subsequently.

The positional relationship between the illumination system 3 and the projection lenses 5 through 9 is rigid, and both the illumination system 3 and the projection lenses 5 through 9 are moved with respect to the calibration unit 10, the mask 2, and the plate 4 for scanning.

In FIG. 8, a controller 100 is a control section which comprises memories such as microprocessors, ROMs, and RAMs. The controller 100 controls illumination for the projection lenses 5 through 9 by controlling a motor (or a solenoid) which respectively drives the filters f1 through f5 based on the output from the sensors S1 through S6 and sensors S11 through S15. The control program for the controller 100 will be described later.

Figure 10:
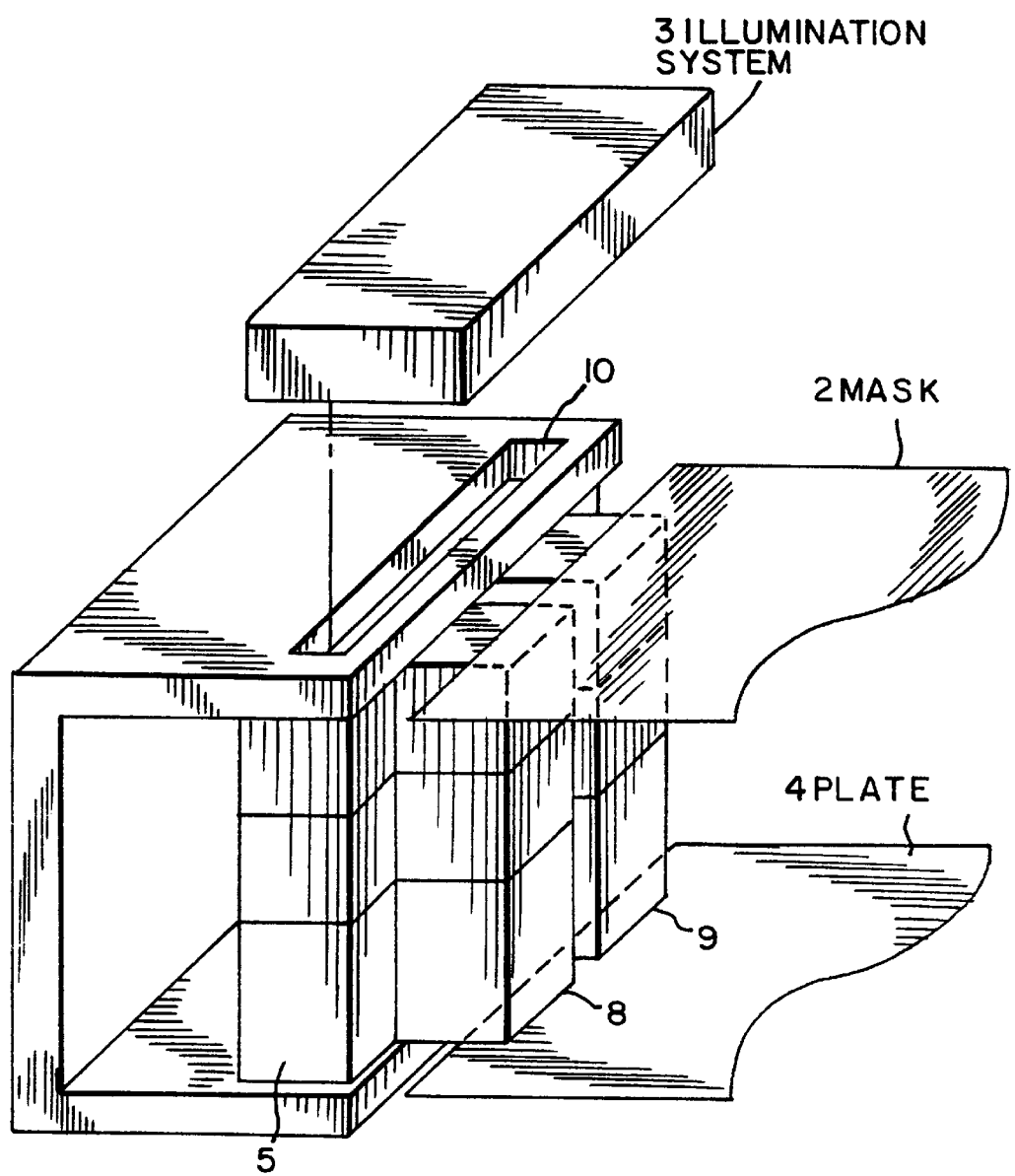
FIG. 10 is a perspective diagram illustrating the manner in which illumination intensities are measured by the embodiment of FIG. 8.
Figure 11:
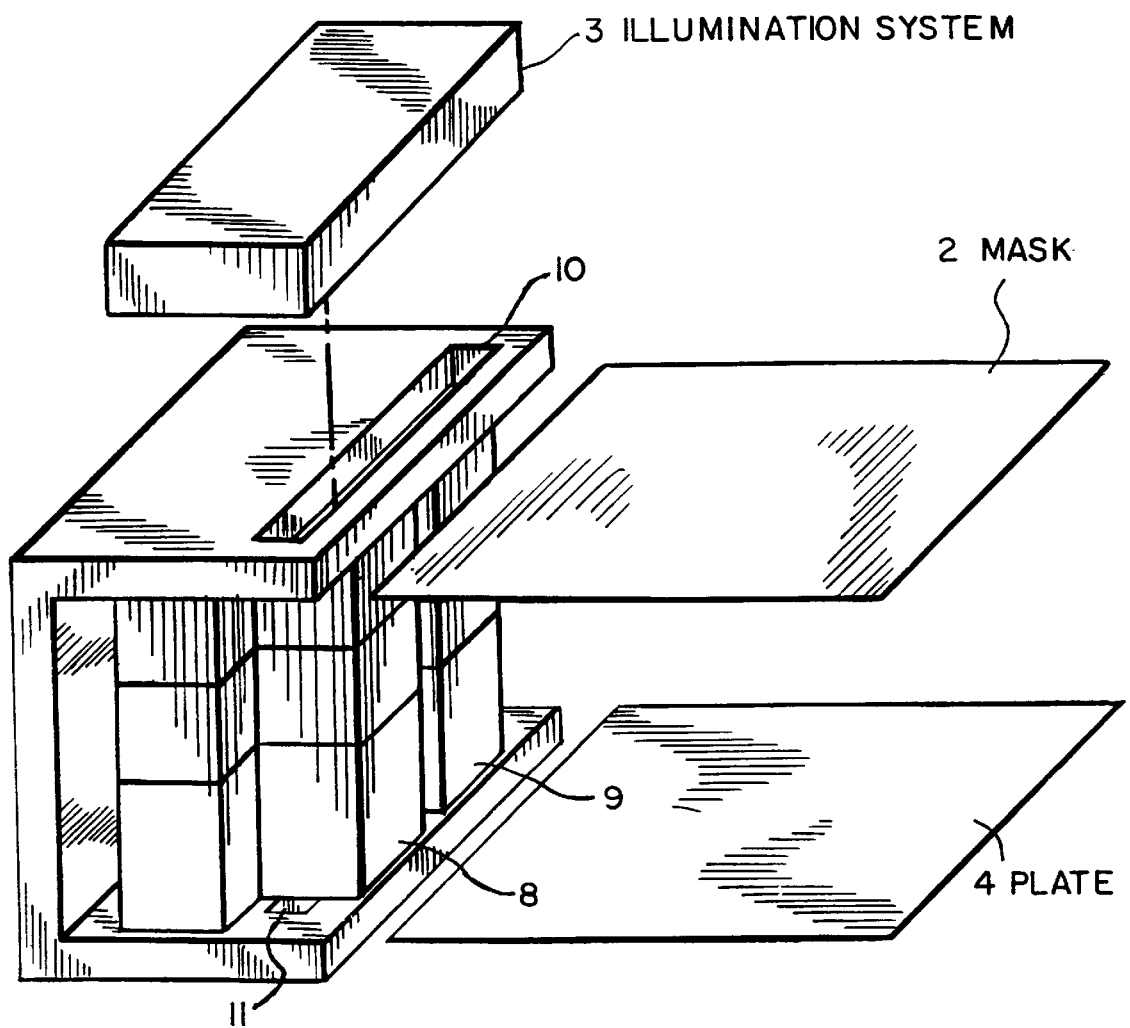
FIG. 11 is a perspective diagram showing the way illumination intensities are measured by the exposure apparatus of FIG. 8.

FIG. 10 shows how illumination intensities are measured by the sensors S1 through S6 through the projection lenses 5, 6, and 7. FIG. 11 shows the state of the projection lenses 8 and 9 during their illumination measurement. As shown in FIG. 10, the projection lenses 5, 6, and 7 are at the positions at which the sensors S1 through S6 are positioned. In FIG. 11, the projection lenses 8 and 9 are moved to the positions where the sensors S1 through S6 are positioned.

Figure 12:
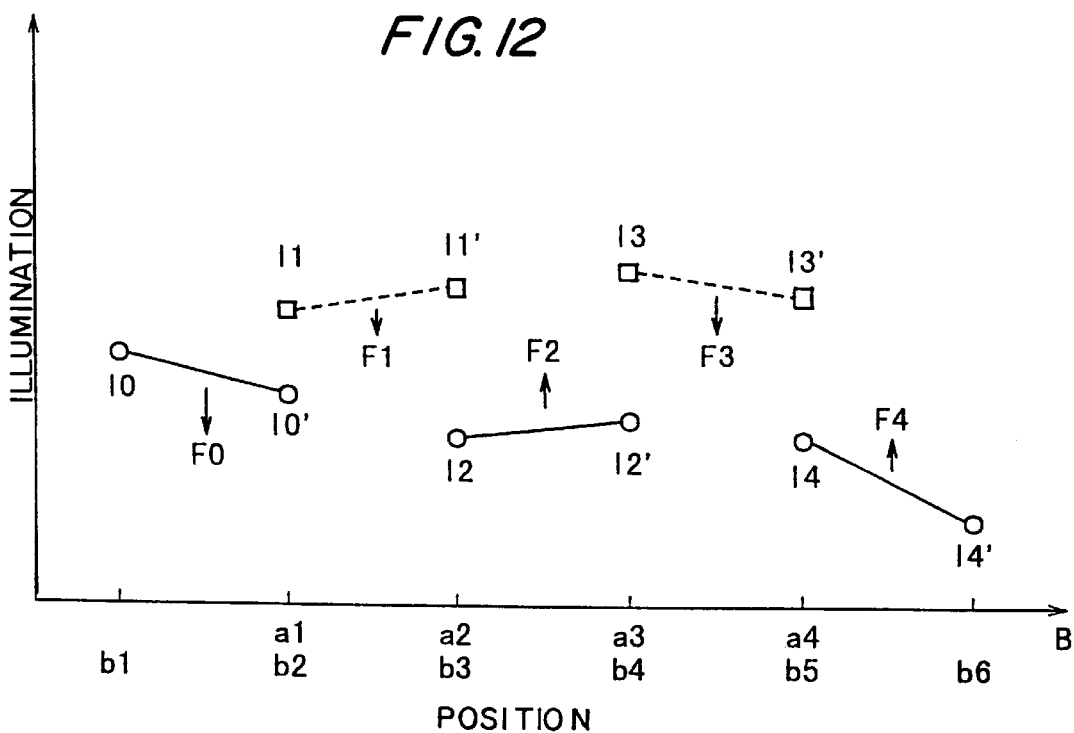
FIG. 12 is a line graph showing the results of the illumination intensity measurements taken by the exposure apparatus of FIG. 8.

The results of measurement obtained, for example, are shown in FIG. 12. a1 through a4, b1 through b6 in FIG. 12 are equal to the measurement points performed by the sensors S1 through S6 in FIG. 8. In other words, b1 is the measurement point for S1; a1 and b2 are for the sensor S2; a2 and b3 are for the sensor S3; a3 and b4 are for the sensor S4; a4 and b5 are for the sensor S5, and b6 is for the sensor S6.

The illumination control by the controller 100 will now be described.

First, the technique in which one of the projection lenses is fixed and the difference in illumination intensity between the overlapped portions of the adjacent projection lenses is adjusted to be zero.

Figure 13:
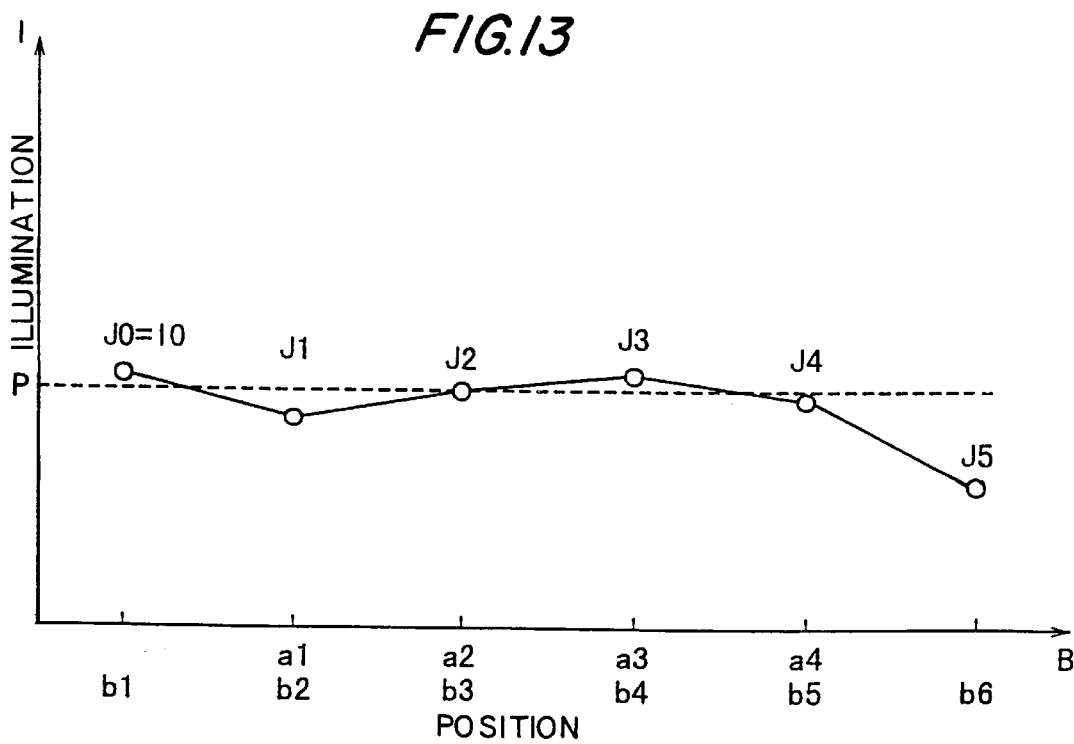
FIG. 13 is a line graph showing the results of illumination intensity adjustment in the embodiment of FIG. 8.

The specific calculation method applicable when the illumination intensity of the projection lens 5 is fixed is described, referring to FIG. 13. FIG. 13 shows the illumination intensities after adjustment measured at each of the measurement points. J0 through J5 in FIG. 13 are the illumination intensities after adjustment, which are obtained by the following equations.

Mathematical Equations 1

$J_0 = I_0$
$J_1 = I_0 + (I'_0 - I_0)$
$J_2 = I_0 + (I'_0 - I_0) + (I'_1 - I_1)$
$J_3 = I_0 + (I'_0 - I_0) + (I'_1 - I_1) + (I'_2 - I_2)$
$J_4 = I_0 + (I'_0 - I_0) + (I'_1 - I_1) + (I'_2 - I_2) + (I'_3 - I_3)$
$J_5 = I_0 + (I'_0 - I_0) + (I'_1 - I_1) + (I'_2 - I_2) + (I'_3 - I_3) + (I_4 - I_4)$

In other words, this can be expressed in a general equation as follows:

Mathematical Equations 2

$$J_i = I_0 + \sum_{n=1}^{i} (I'_{n-1} - I_{n-1}) \quad (\text{where } i > 0)$$

$$J_0 = I_0 \quad (\text{where } i = 0)$$

In order to control illumination intensities for the projection lenses 5, 6, 7, 8, and 9, the offset illumination intensities F0, F2, F4, F1, and F3 given to the illumination units 3a, 3b, 3c, 3d, and 3e are the differences between the real values and target values of illumination intensity, obtained from the following equations. F0 is the offset illumination intensity for the illumination unit 3a, F1 for the illumination unit 3d, F2 for the illumination unit 3b, F3 for the illumination unit 3e, and F4 for the illumination unit 3c.

Mathematical Equations 3

$$F_0 = 0$$
$$F_1 = J_1 - I_1$$
$$F_2 = J_2 - I_2$$
$$F_3 = J_3 - I_3$$
$$F_4 = J_4 - I_4$$

In other words, this can be expressed in a general equation as follows:

Mathematical Equation 4

$$F_i = J_i - I_i$$

The controller 100 drives motors (or solenoids) M1 through M5 for filters f1 through f5 based on the obtained offset illumination intensities such that the illumination intensity of each of the projection lenses reaches a target value. At that time, the measurement values from the sensors S11 through S15 are used.

In this way, using the illumination intensity of a predetermined projection lens (the projection lens 5 in the above embodiment) as a base, the illumination difference between overlapped portions of adjacent projection lenses among the projection lenses 5 through 9 can be made zero.

Figure 14:
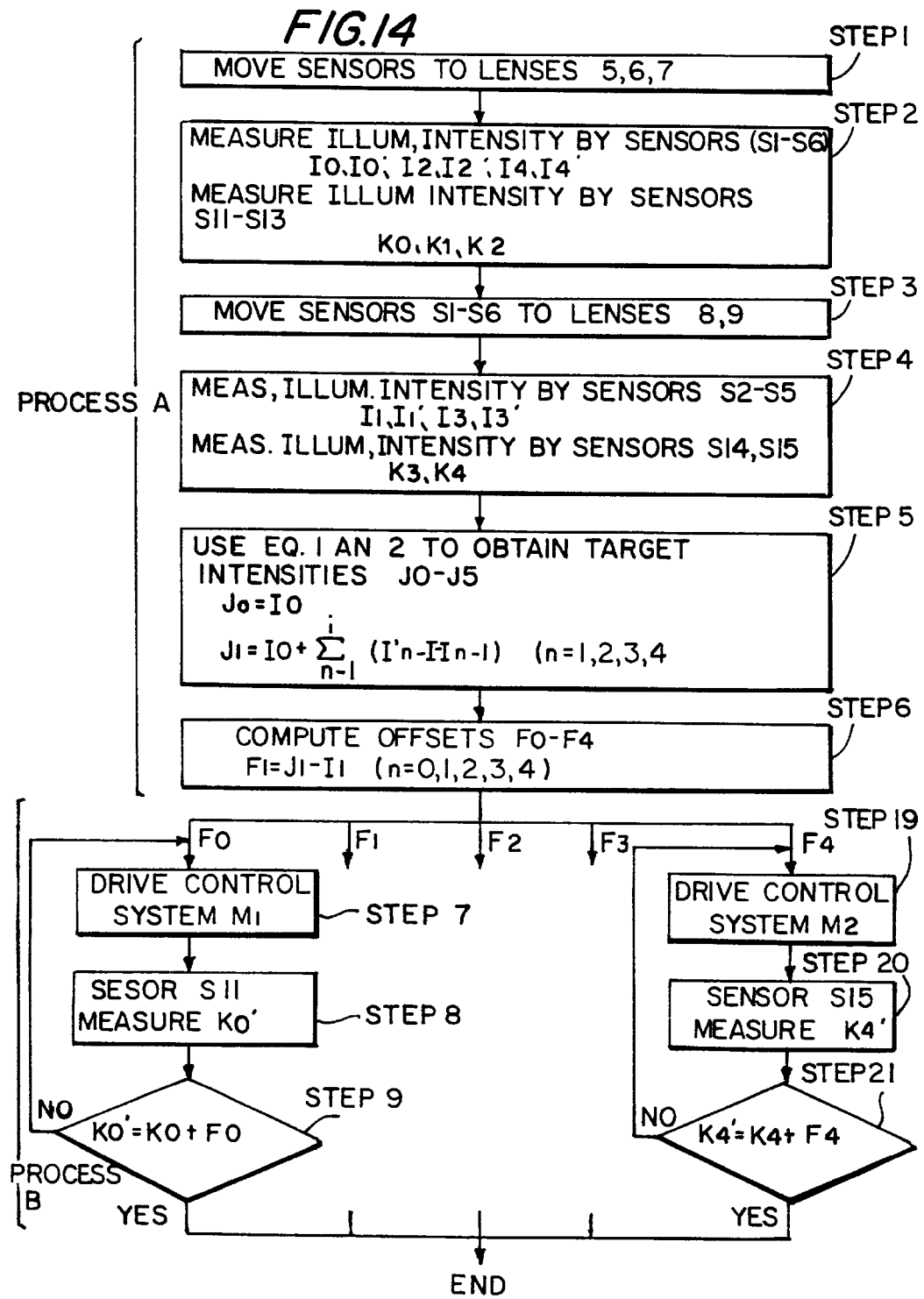
FIG. 14 is a flowchart showing the method incorporating the principles of the present invention to adjust the illumination intensity to produce the results of FIG. 13.

The controller 100 performs the adjustment shown in FIG. 13 and expressed in mathematics equations 1 through 4 by performing the control shown in the flowchart in FIG. 14. In FIG. 14, the control method using the sensors S11 through S15 is also described.

In step 1 in FIG. 14, the sensors S1 through S6 move to the alignment position (the position shown in FIG. 10) with the projection lenses 5, 6, and 7.

In step 2, the sensors S1 through S6 measure the illumination intensities I0, I0', I2, I2', I4, and I4' as shown in FIG. 12. Also, in order to synchronously control the closed loop described later, the sensors S11, S12, and S13 measure the illumination intensities K0, K1, and K2 at the entering side of the illumination light through the optical systems. This is measured by reflection from the half mirrors 11 through 13, respectively.

Then, in step 3, the sensors S1 through S6 move to the alignment position (the position shown in FIG. 11) with the projection lenses 8 and 9. In this position, it is clear that only sensors S2 through S5 are used, since no projection lenses are aligned with sensors S1 or S6.

In step 4, the sensors. S2 through S5 measure the illumination intensities I1, I1', I3, and I3' as shown in FIG. 12. In addition, for the synchronous control of the closed loop described later, the sensors S14 and S15 need to measure the illumination intensities K3 and K4 in advance at the entering side of the illumination light through the optical systems.

In step 5, the above mathematical equations 1 and 2 are computed to obtain the target illumination intensities J0 through J5 at the overlapped portions of each of the respective projection lenses. In step 6, by the differences between target illumination intensities J0 through J5 and real values, the offsets F0 through F4 are obtained for each of the illumination units 3a through 3e (equal to the values obtained through the mathematical equations 3 and 4).

Then, the controller 100 controls the illumination intensities of each of the illumination units 3a through 3e in the closed loop configuration by the outputs from the illumination offsets F0 through F4 and the sensors S11 through S15.

Regarding the control of the closed loop, FIG. 14 specifically shows the control of only the illumination units 3a and 3e (steps 7 through 9 and steps 19 through 21, respectively).

For example, regarding the illumination unit 3a, the illumination control system M1 (motor, solenoid, etc.) which controls the position of the filter f1 is controlled in step 7. In this case, however, in step 8, the sensor S11 needs to measure a real illumination value K0' at the entering side of the optical system 5. The controller 100 determines whether or not the initial illumination intensity value has reached the sum of the initial illumination intensity value K0 and the illumination offset F0, resulting in determination of the parameter needed to drive the filter f1.

According to the above embodiment, because a plurality of sensors S11 through S15 are arranged for the synchronous measurement of illumination light intensity at the entering side of the illumination light at a plurality of projection lenses, quick measurement and control of illumination intensity is possible. Accordingly, the apparatus can be configured inexpensively yet compact and light without requiring a sensor scanning system needed for the conventional configuration using a unified sensor.

Note that in the flowsheet shown in FIG. 14, steps 1 through 6 (process A) need to be executed at a separate time from the exposure sequence. For example, they may be executed at a predetermined time before the exposure sequence begins.

On the other hand, because a plurality of sensors S11 through S15 are arranged for the synchronous measurement of illumination light intensity at the entering side of the illumination light at a plurality of projection lenses, the illumination control after step 7 may be executed at an arbitrary time even during the exposure sequence. If the illumination offsets F0 through F4 have already been computed, the execution of a frequent illumination control after step 7 allows the accurate control of the illumination light intensity control.

In other words, the above embodiment provides great advantages in that the illumination can be calibrated even during the exposure sequence, thus allowing an accurate and reliable exposure control.

In the previous embodiment, a technique is described in which illumination light intensity of one of the projection lenses is fixed as a base and the other illumination intensities are arranged in accordance with this base illumination intensity. In the second embodiment, adding an arbitrary offset to all of the illumination offsets F0 through F4, while maintaining the illumination intensity, provides an arbitrary illumination maintaining a zero difference between the overlapped portions.

Figure 15:
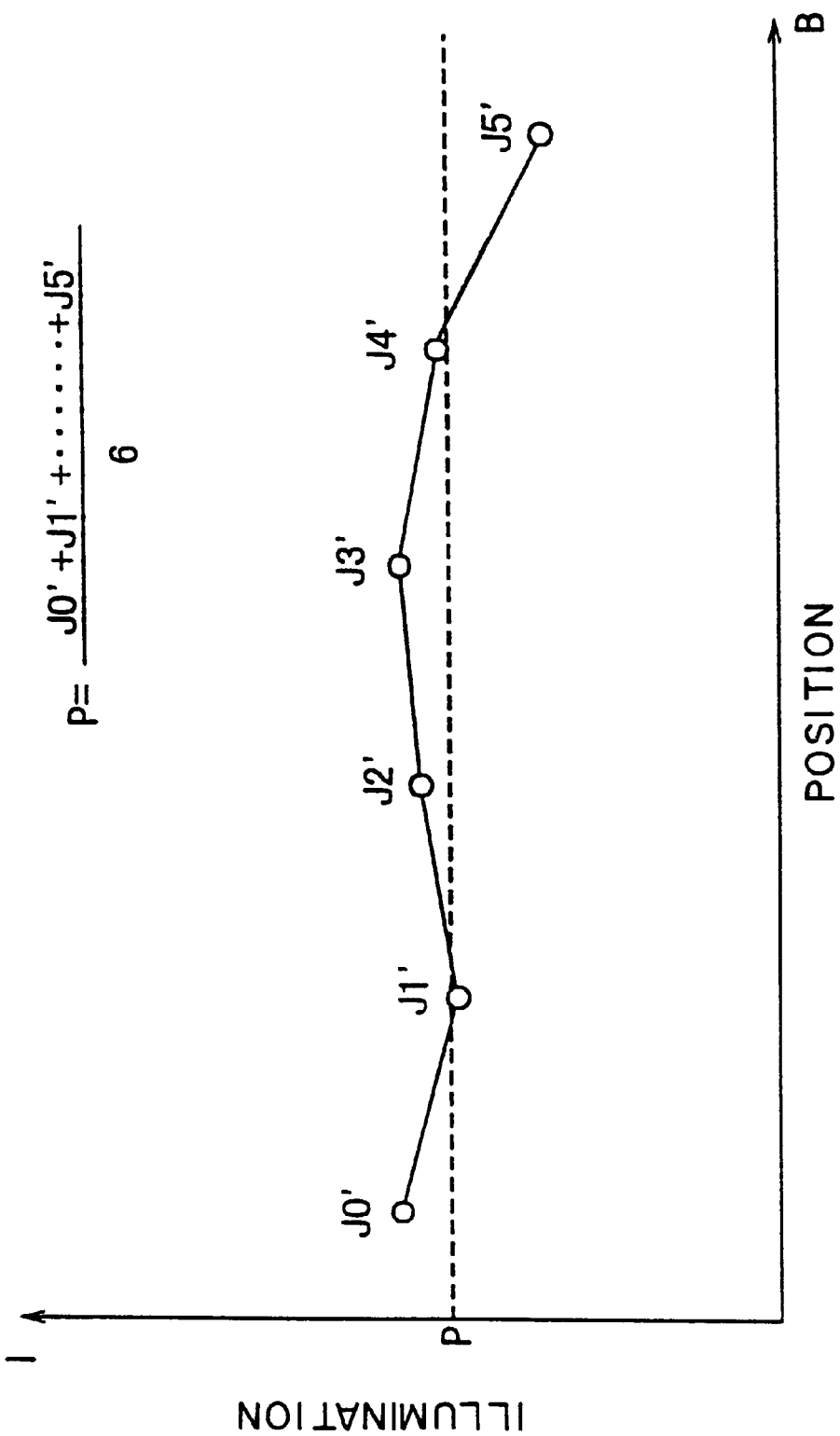
FIG. 15 is a line graph showing the results of illumination intensity adjustment in a second embodiment of the present invention.

For example, FIG. 15 shows an example in which the offset ΔP' is uniformly added to the illumination offsets F0 through F4 in order to have the average illumination intensity after adjustment equal to a target illumination intensity P. In FIG. 15, the illumination offsets F0 through F5 are determined as follows. Note that the offset ΔP' is the offset commonly added to the illumination offsets F0 through F5.

Mathematical Equations 5

$$\Delta P' = P - \frac{\sum_{i=0}^{5} J_i}{6}$$

$$F_i = J_i - I_i + \Delta P'$$

Figure 16:
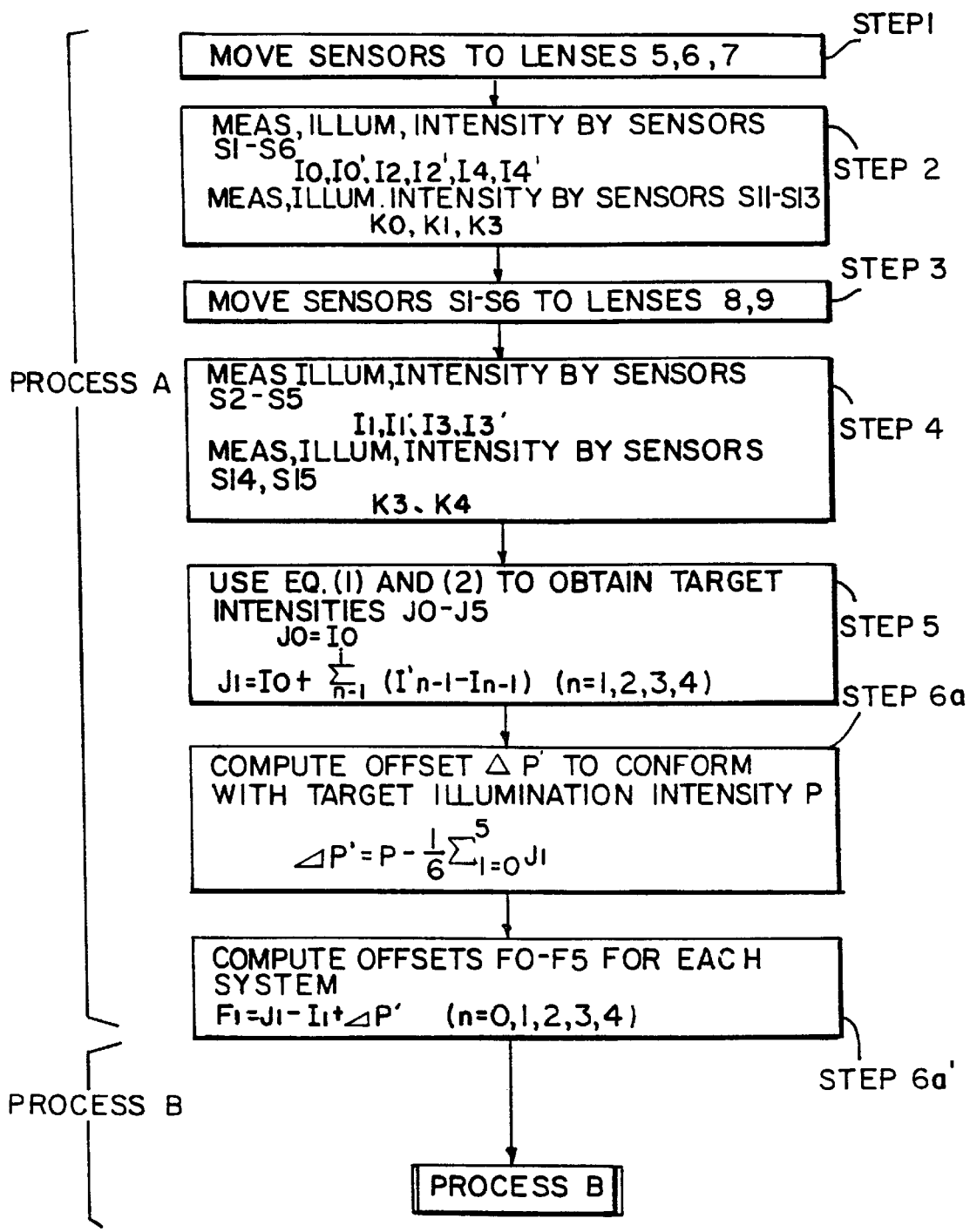
FIG. 16 is a flowchart showing the method incorporating the principles of the present invention to adjust the illumination intensity to produce the results of FIG. 15.

The process for the above adjustment in the second embodiment is shown in the flowchart of FIG. 16. The flow of the entire process is the same as in FIG. 14. The difference between FIGS. 16 and 14 is that step 6 in FIG. 14 is replaced with steps 6a and 6a'.

In step 6a, the offset ΔP' is computed by the above mathematical equations (5) such that it is added to the illumination offsets F0 through F4. In step 6a', a target value $J_i$ and a real value $I_i$ are computed. Then, the illumination offsets F0 through F4 are computed with the offset ΔP'.

By adding the offset ΔP' to all the illumination offsets F0 through F4, the average illumination intensity after adjustment and a target illumination intensity P can be controlled to be equal while maintaining a zero illumination difference between the overlapped portions. Note that in FIG. 16, the process B is not illustrated because it is the same as the process shown in FIG. 14.

The offset for correcting the illumination offsets F0 through F4 is not limited to the above-described second embodiment. For example, another way to obtain such correction may be to add a certain offset commonly to the illumination offsets F0 through F4 such that the difference between the maximum value of the illumination intensity after adjustment and the difference between the minimum value of the illumination intensity after adjustment and a target value P both are minimized.

Figure 17:
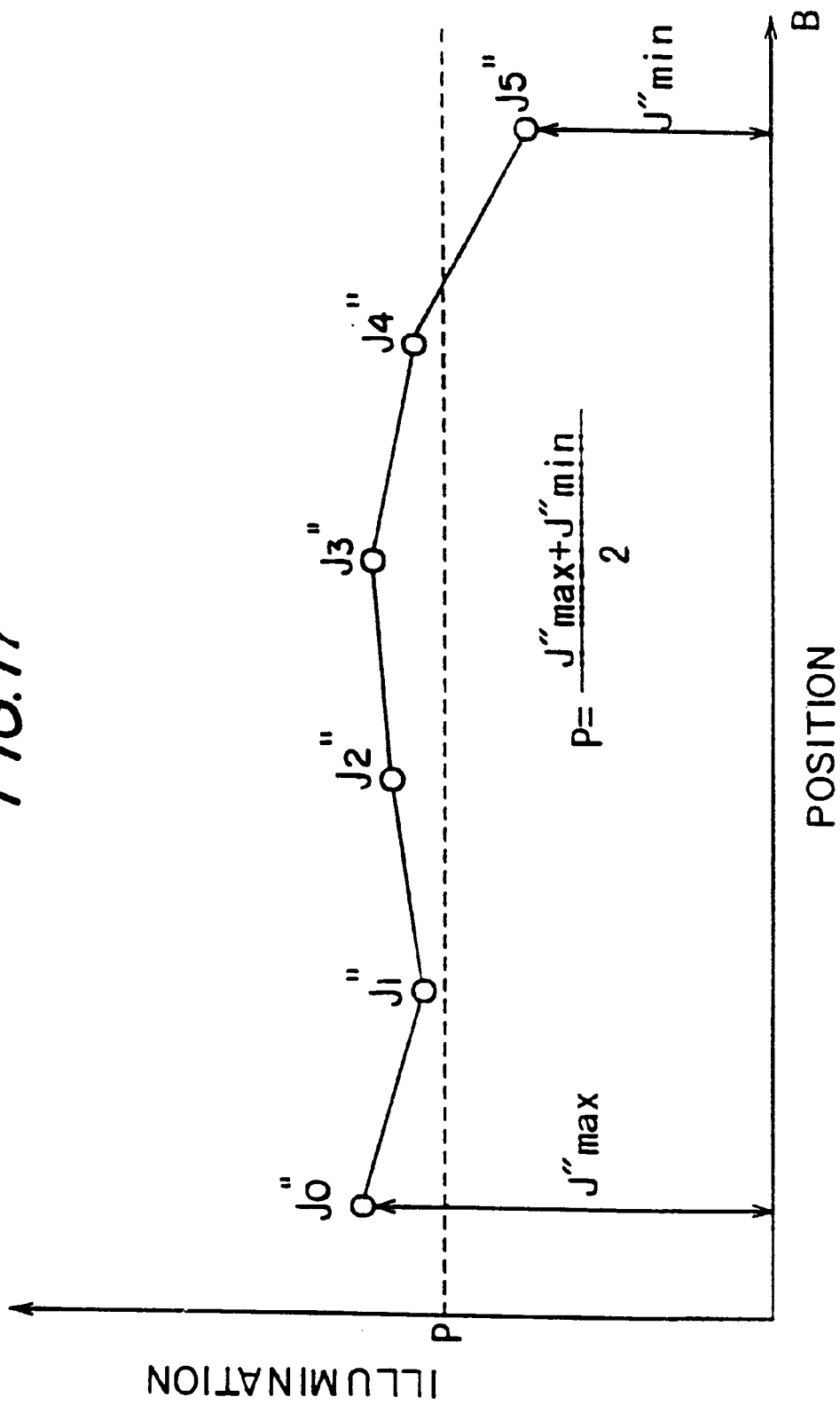
FIG. 17 is a line graph showing the results of illumination intensity adjustment in a third embodiment of the present invention.

In other words, FIG. 17 shows an example in which the difference between the maximum value of the illumination intensity after adjustment and the target value P and the difference between the minimum value of the illumination intensity after adjustment and the target value P both are minimized. In FIG. 17, the illumination offsets F0 through F5 are determined by the equations which follow. Note that the offset ΔP" is the offset commonly added to the illumination offsets F0 through F5 [max (J0 . . . J5) is the maximum value of J0 through J5, min (J0 . . . J5) is the minimum value of J0 through J5].

Mathematical Equations 6

$$\Delta P'' = P - \frac{\max(J_0, J_1 \ldots J_5) + \min(J_0, J_1 \ldots J_5)}{2}$$

$$F_i = J_i - I_i + \Delta P''$$

Figure 18:
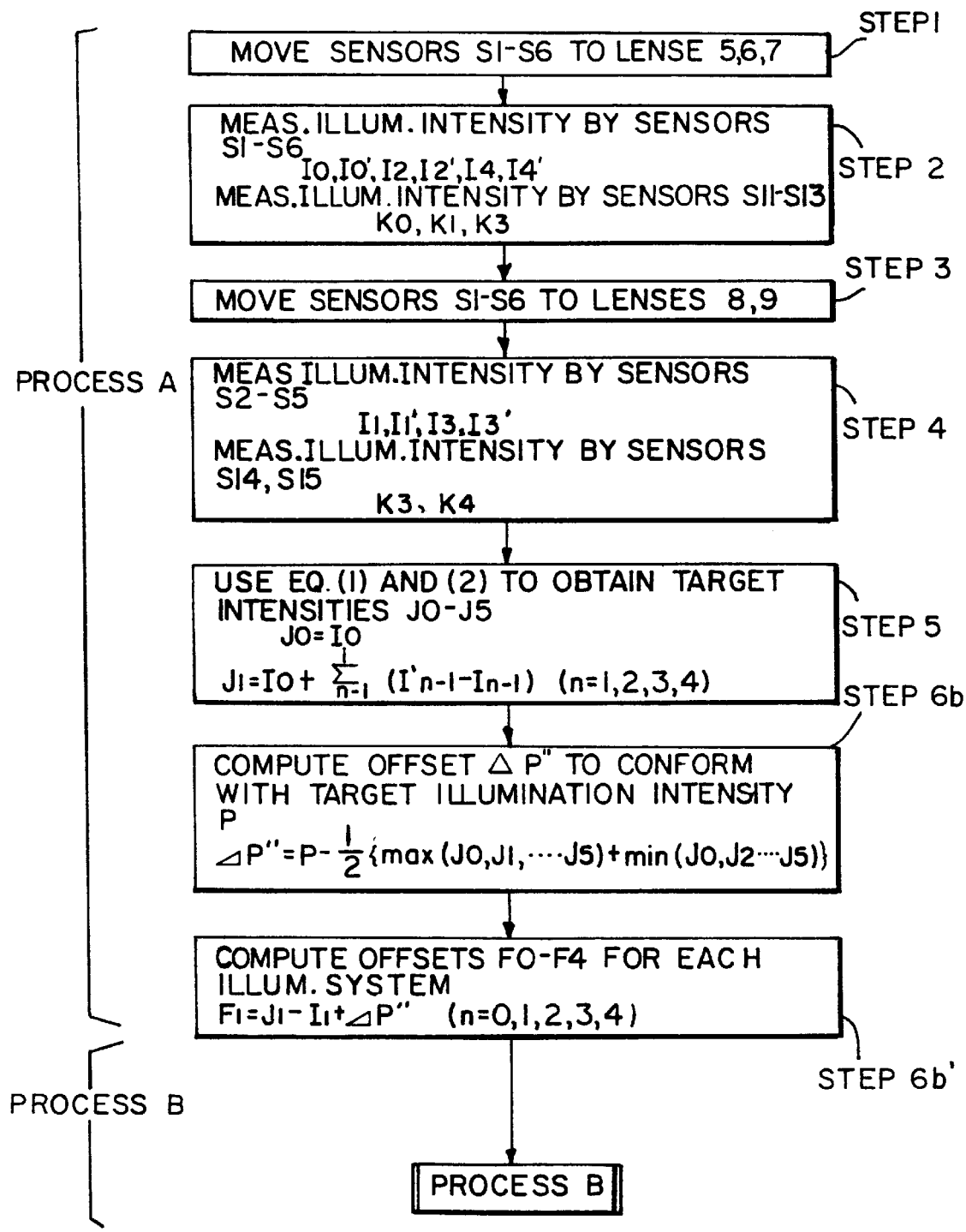
FIG. 18 is a flowchart showing the method incorporating the principles of the present invention to adjust the illumination intensity to produce the results of FIG. 17.

The process for the above adjustment in the third embodiment is shown in the flowchart of FIG. 18. The steps of the entire process is the same as FIG. 14. The difference between FIGS. 18 and 14 is that step 6 in FIG. 14 is replaced with steps 6b and 6b'.

In step 6b, the offset ΔP" is computed from the above mathematical equations (6) to be added to the illumination offsets F0 through F4. In step 6b, the target value $J_i$ and a real value $I_i$ are computed, and the illumination offsets F0 through F4 are computed from the target value J1, the real value, and the offset ΔP".

By adding the offset ΔP" to all the illumination offsets F0 through F4, the difference between the maximum value of the illumination intensity after adjustment and the target value P, and the difference between the minimum value of the illumination intensity after adjustment and the target value P both are minimized while maintaining a zero illumination difference between overlapped portions. Note that also in FIG. 18, the process B is not shown because it is the same as the process B shown in FIG. 14.

Also note that in the present embodiment, an exposure apparatus which holds the mask 2 and the plate 4 horizontally is used. However, the present invention is not limited to this. For example, it is applicable to the exposure apparatus of the type which synchronously moves the mask 2 and the plate 4 by holding them vertically.

As is apparent from the above description, according to the present invention, because a plurality of sensors S11 through S15 are arranged for the synchronous measurement of illumination light intensity at the entering side of the illumination light at a plurality of projection lenses, quick measurement and control of illumination intensity is possible and the apparatus can be configured inexpensively yet compact and light without requiring a sensor scanning system needed for the conventional configuration using a unified sensor.

Various modifications will become possible for those skilled in the art after receiving the teachings of the present disclosure without departing from the scope thereof.

What is claimed is:

1. A method for exposing a photomask pattern onto a photosensitive substrate via a plurality of optical systems comprising the steps of:

irradiating said photomask pattern with beams of light adapted to pass through said optical systems onto said substrate, a projection area of each of said respective optical systems having an overlap portion which overlaps a projection area of adjacent optical systems by a predetermined overlap amount;

synchronously scanning said photomask pattern with said beams of light in a first scanning direction to transfer said pattern to said substrate; and substantially simultaneously measuring the illumination intensities of said beams of light passing through said optical systems by a plurality of detectors arranged at an angle to said first scanning direction, said plurality of detectors being disposed to respond to said overlap portion.

2. A method, as claimed in claim 1, including the steps of measuring the illumination intensities of at least two adjacent optical systems of said plurality of optical systems; and controlling the illumination intensities of said plurality of optical systems based on said measurement.

3. A method, as claimed in claim 2, wherein the illumination intensities of said plurality of optical systems are controlled such that the difference in illumination intensities between adjacent optical systems is small.

4. A method, as claimed in claim 2, including the steps of determining a desired target illumination intensity and controlling the illumination intensities of said plurality of optical systems such that the difference in illumination intensities between adjacent optical systems is small and that the average value of the illumination intensities of all of the optical systems is in accordance with said target intensity.

5. A method, as claimed in claim 2, including the steps of determining a desired target illumination intensity and controlling the illumination intensities of said plurality of optical systems such that while making the difference in illumination intensities small between adjacent optical systems, the difference between said target intensity and the maximum value of all of the illumination intensities and the difference between said target intensity and the minimum value of all of said illumination intensities are minimized.

6. A method, as claimed in claim 2, including the steps of measuring the intensity of illumination light entering each of said plurality of optical systems, computing the amount of control needed to obtain a target illumination intensity based on said light entering measurement and controlling the illumination intensities of said plurality of optical systems based on said amount of control.

a source of illumination for irradiating said photomask pattern with beams of light adapted to pass through said pattern and said optical systems onto said substrate;

a scanning mechanism for synchronously scanning said photomask pattern with said beams of light to transfer said pattern to said substrate; and a first plurality of illumination intensity measuring devices for substantially simultaneously measuring the illumination intensities of said beams of light passing through said optical systems.

7. A method, as claimed in claim 1, wherein the angle between said plurality of detectors and said first scanning direction is substantially 90°.

8. A method according to claim 1, wherein said projection area is trapezoidal in shape and said plurality of detectors are spaced from each other by a distance which is longer than the short parallel side of said trapezoidal shape and shorter than the long parallel side of said trapezoidal shape.

9. A method according to claim 1, wherein the number of said detectors is greater than the number of said optical systems.

10. A scanning exposure apparatus for moving a mask with respect to a plurality of optical systems while illuminating said mask on which a transfer pattern is formed and synchronously moving a photosensitive substrate with respect to said plurality of optical systems, thereby projecting and exposing said pattern onto said substrate through said plurality of optical systems comprising:

a source of illumination which irradiates said photomask pattern with beams of light adapted to transfer said pattern onto said substrate; and a first plurality of illumination intensity measuring devices which substantially simultaneously measure the illumination intensities of said beams of light passing through said optical systems, said plurality of illumination intensity measuring devices being disposed at an angle to the direction of movement of said mask and said photosensitive substrate, the illumination intensity of said beam of light passing through at least one of said optical systems being measured by a plurality of detectors included in said first plurality of illumination intensity measuring devices.

11. Apparatus, as claimed in claim 10, wherein at least one of said first plurality of measuring devices measures the illumination intensities of at least two adjacent optical systems of said plurality of optical systems; and wherein a controller controls the illumination intensities of said plurality of optical systems based on said measurement by said one measuring device.

12. Apparatus, as claimed in claim 11, wherein said controller controls the illumination intensities of said plurality of optical systems such that the difference in illumination intensities between adjacent optical systems is small.

13. Apparatus, as claimed in claim 11, said controller determines a desired target illumination intensity and controls the illumination intensities of said plurality of optical systems such that the difference in illumination intensities between adjacent optical systems is small and that the average value of the illumination intensities of all of the optical systems is in accordance with said target intensity.

14. Apparatus, as claimed in claim 11, wherein said controller determines a desired target illumination intensity and controls the illumination intensities of said plurality of optical systems such that while making the difference in illumination intensities small between adjacent optical systems, the difference between said target intensity and the maximum value of all of the illumination intensities and the difference between said target intensity and the minimum value of all of said illumination intensities are minimized.

15. Apparatus, as claimed in claim 11, including a second plurality of measuring devices for measuring the intensity of illumination light entering each of said plurality of optical systems, and wherein said controller computes the amount of control needed to obtain a target illumination intensity based on said light entering measurement and controls the illumination intensities of said plurality of optical systems based on said amount of control.

16. Apparatus, as claimed in claim 10, wherein said angle between said plurality of illumination intensity measuring device and said direction of movement is substantially 90°.

17. An apparatus according to claim 7, wherein said optical systems projection area is trapezoidal in shape and said plurality of detectors are spaced from each other by a distance which is longer than the short parallel side of said trapezoidal shape and shorter than the long parallel side of said trapezoidal shape.

18. An apparatus according to claim 7, wherein the number of said detectors is greater than the number of said optical systems.

* * * * *